United States Patent [19]

Yamamoto et al.

[11] 4,151,034

[45] Apr. 24, 1979

[54] CONTINUOUS GAS PLASMA ETCHING APPARATUS

[75] Inventors: Shinichi Yamamoto; Yasusuke Sumitomo, both of Yokohama; Yasuhiro Horiike, Tokyo; Masahiro Shibagaki, Hiratsuka, all of Japan

[73] Assignee: Tokyo Shibaura Electric Co., Ltd., Kawasaki, Japan

[21] Appl. No.: 862,161

[22] Filed: Dec. 19, 1977

[30] Foreign Application Priority Data

Dec. 22, 1976 [JP] Japan ................... 51-153314

[51] Int. Cl.² ............... H01L 21/306; C23F 1/00
[52] U.S. Cl. ......................... 156/345; 156/643; 156/646; 219/121 P
[58] Field of Search ............ 156/643, 646, 345; 219/121 P; 250/531; 204/164, 192 E, 298

[56] References Cited

U.S. PATENT DOCUMENTS

| | | | |
|---|---|---|---|
| 3,410,776 | 11/1968 | Bersin | 204/193 |
| 3,654,108 | 4/1972 | Smith | 250/544 X |
| 3,879,597 | 4/1975 | Bersin et al. | 219/121 P |
| 4,065,369 | 12/1977 | Ogawa et al. | 204/164 |

FOREIGN PATENT DOCUMENTS 50-14997 5/1975 Japan.
52-9353 3/1977 Japan.

OTHER PUBLICATIONS

Region of Chemistry 25, 713 (1971) by Keiichiro Hozumi, pp. 206-214.

Plasma Chemistry in Electrical Discharge by McTaggart et al., Amsterdam (1969) pp. 60, 69.
I. I. Industries Incorporated (USA) Automatic Photoresist Developer Model, CD-1,2,3,4D.
J. Appl. Polym. Sci. 13E, 807 (1969) J. R. Hollahan et al., p. 809.

Primary Examiner—William A. Powell
Attorney, Agent, or Firm—Oblon, Fisher, Spivak, McClelland & Maier

[57] ABSTRACT

A continuous gas plasma etching apparatus comprising a reaction chamber having an inlet means and an outlet means, an activation portion disposed at a distance from said reaction chamber, a distributor means for uniformly supplying said reaction chamber with an activated gas produced in said activation proton, an exhaust means for exhausting the gas inside said reaction chamber from a plurality of gas outlets, a conveyer means disposed inside said reaction chamber to transfer workpieces from the inlet means side to the outlet means side in said reaction chamber, a feeding chamber disposed on the inlet means side of said reaction chamber to contain the workpieces, a workpiece feeding means for feeding the workpieces in said feeding chamber from said inlet means to said conveyer means, a first shutter means for opening and shutting said inlet means, a receiving chamber disposed on the outlet means side of said reaction chamber to receive the workpieces treated with said activated gas in said reaction chamber, a treated workpiece delivering means for introducing the treated workpieces in said reaction chamber into said receiving chamber through said outlet means, and a second shutter means for opening and shutting said outlet means.

14 Claims, 3 Drawing Figures

CONTINUOUS GAS PLASMA ETCHING APPARATUS

This invention relates to a continuous gas plasma etching apparatus.

In place of the conventional etching technique using a wet solution, etching technique by means of gas plasma, such as $CF_4$, has recently been widely accepted. This gas plasma etching technique is applicable to etching of films of polycrystalline silicon, silicon dioxide and silicon nitride in the fabrication processes for semiconductor devices such as IC's (integrated circuits) as well as to ashing of photoresists. This gas plasma etching technique has various advantages over the wet-chemical etching; easier operation, higher reliability, and no environmental pollution.

Apparatuses for achieving such gas plasma etching are generally composed of a cylindrical quartz reaction chamber with a high-frequency coil wound round the exterior thereof, performing etching of poly-Si and the like within the reaction chamber by means of gas plasma produced by applying a high frequency to a reaction gas introduced into the reduced reaction chamber. That is, production of the gas plasma and etching of workpieces have been achieved in one and the same place. Therefore, in these apparatuses, the size of the reaction chamber is limited, so that the number of workpieces treated at a time connot be increased. Further, the production of plasma and etching of workpieces would take place in the same place, so that the workpieces would substantially be damaged by the plasma or observation of the interior of the reaction chamber would be prevented by the emission inside the reaction chamber.

These problems have been solved by employing a mixed gas of substantially equivalent $CF_4$ and $O_2$ as the feed gas, introducing the mixed gas into a plasma-generating chamber, applying thereto a high-frequency by means of parallel-plate electrodes or high-frequency coils disposed therein, thereby producing a long-life etching gas, and then etching poly-Si and the like by means of the etching gas in the reaction chamber substantially separated from the plasma-generating chamber. These gas plasma etching apparatuses with the plasma-generating chamber separate from the reaction chamber, however, are of a batch type which is manually operated, and there have so far been proposed no such apparatuses that enable continuous and automatic etching.

An object of this invention is to provide a gas plasma etching apparatus with separately arranged plasma-generating chamber and reaction chamber, capable of continuously, automatically etching workpieces.

According to the invention, there is provided a continuous gas plasma etching apparatus comprising a reaction chamber having an inlet means and an outlet means, an activation portion disposed at a distance from the reaction chamber, a distributor means for uniformly supplying the reaction chamber with an activated gas produced in the activation portion, an exhaust means for exhausting the gas inside the reaction chamber from a plurality of gas outlets, a conveyor means disposed inside the reaction chamber to transfer workpieces from the inlet means side to the outlet means side in the reaction chamber, a feeding chamber disposed on the inlet means side of the reaction chamber to contain the workpieces, a workpiece feeding means for feeding the workpieces in the feeding chamber from the inlet means to the conveyor means, a first shutter means for opening and shutting the inlet means, a receiving chamber disposed on the outlet means side of the reaction chamber to receive the workpieces treated with the activated gas in the reaction chamber, a treated workpiece delivering means for introducing the treated workpieces in the reaction chamber into the receiving chamber through the outlet means, and a second shutter means for opening and shutting the outlet means.

This invention can be more fully understood from the following detailed description when taken in conjunction with the accompanying drawings, in which.

Now I will describe an embodiment of this invention with reference to the accompanying drawings.

Figure 1:
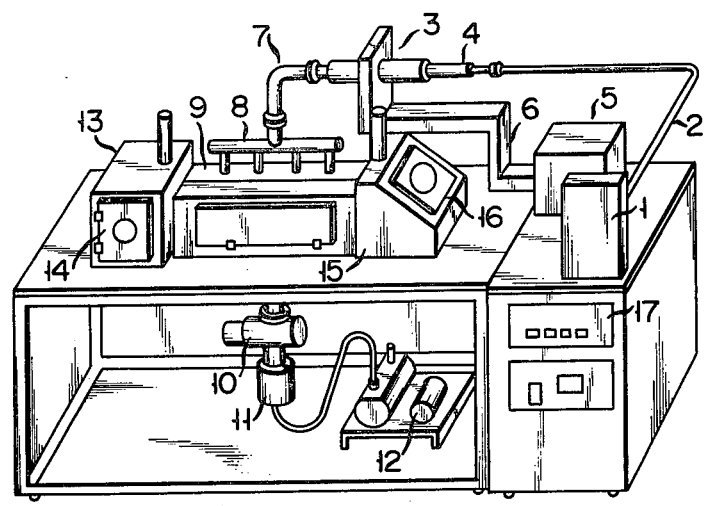
FIG. 1 is a perspective view of the continuous gas plasma etching apparatus according to an embodiment of this invention.

FIG. 1 is a perspective view of the continuous gas plasma etching apparatus according to an embodiment of the invention. Referring now to FIG. 1, a reaction gas containing $CF_4$ gas and $O_2$ gas is introduced from a reaction gas feed chamber 1 to a quartz tube 4 at an activation portion 3 through a conduit 2. Plasma discharge is effected by means of a microwave power applied to the activation portion 3, thereby activating the reaction gas. The reaction gas feed chamber 1 is coupled to $CF_4$ gas, $O_2$ gas, and $N_2$ gas bombs, while the microwave is produced at a microwave oscillator 5 and applied to the activation portion 3 by means of a wave guide 6.

The activated gas, activated at the activation portion 3, is introduced into a reaction chamber 9 through an activated gas conduit 7 and a manifold pipe 8 forming a distributor. By means of the activated gas are etched workpieces, such as semiconductor wafers, in a reaction chamber 9. Then the gas inside the reaction chamber 9 is discharged by using a mechanical booster pump 10 and a rotary pump 12. Between the mechanical booster pump 10 and rotary pump 12 is disposed an oil trap 11.

The workpieces or semiconductor wafers to be treated are first set into a feeding chamber 13 and then fed into the reaction chamber 9. The setting of the wafers into the feeding chamber 13 may be achieved by opening a carrier hatch 14 and introducing into the feeding chamber 13 a carrier loaded with a number of wafers. The wafers treated in the reaction chamber 9 are delivered to a carrier in a receiving chamber 15, and the carrier is taken out from a carrier hatch 16.

The above operations are automatically controlled by a control unit 17. The gas-contact region at the activation portion 3 is formed of quartz so as to transmit the microwave. The parts in contact with the activated gas, including activated gas conduit 7, manifold pipe 8, nozzle pipe 27, and reaction chamber 9, should preferably be formed of fluoride such as Tefron or coated so as to avoid corrosion by the activated gas.

Figure 2:
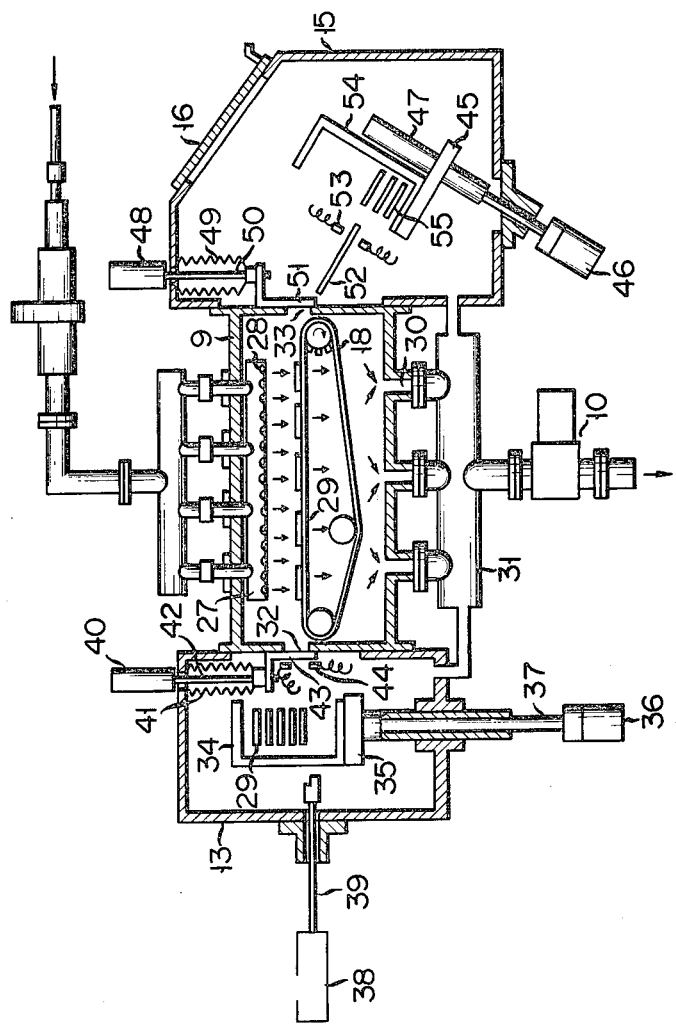
FIG. 2 is a sectional view of the principal part of the apparatus of FIG. 1.

FIG. 2 is a sectional view of the principal mechanism of the apparatus of FIG. 1, which will be described in detail.

Figure 3:
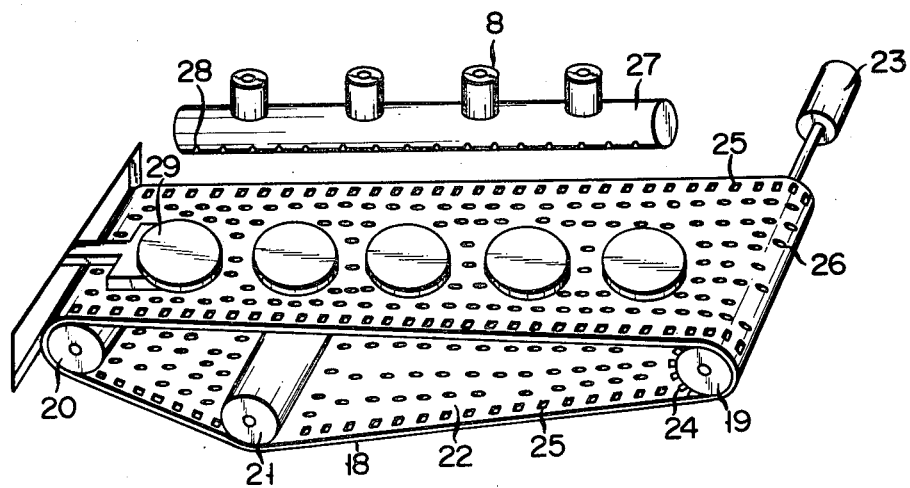
FIG. 3 is a perspective view showing the conveyor and nozzle pipe of the apparatus of FIG. 1.

Referring now to FIG. 2, the reaction chamber 9 is provided with a built-in conveyer 18 running from the vicinity of a wafer inlet 32 to the vicinity of an outlet 33. The mechanism of this conveyer 18 is shown in detail in FIG. 3. Turning now to FIG. 3, an endless belt 22 is passed round a sprocket 19 and pulleys 20 and 21. Teeth 24 of the sprocket 19 are engaged with perforations 25 of the belt 22, and the sprocket 19 rotates as a motor 23 is operated, thereby running the belt 22. The belt 22 is covered with pores 26 for facilitating the circulation of the activated gas.

Above the conveyer 18 in the reaction chamber 9 is disposed substantially in parallel with the conveyor 18 the nozzle pipe 27, which is provided with a plurality of nozzle holes 28 to face the wafers 29 carried by the conveyor 18. At the bottom portion of the reaction chamber 9 are arranged along the lower portion of the conveyor 18 a plurality of gas outlets 30, which are connected to an exhaust gas system by means of an exhaust manifold 31. The exhaust manifold 31 is also connected with the feeding chamber 13 and receiving chamber 15.

The reaction chamber 9 is connected with the feeding chamber 13 by means of the wafer inlet 32 and with the receiving chamber 15 by means of the wafer outlet 33. In the feeding chamber 13 an carrier 34 containing a number of wafers is placed on a carrier mount 35 which is moved up and down by means of a feed screw 37 rotated by a motor 36. Further, the feeding chamber 13 is fitted with a wafer pusher 39 reciprocated by an air cylinder 38, and the wafers 29 in the carrier 34 are fed into the reaction chamber 9 by means of the wafer pusher 39. In addition, the feeding chamber 13 is provided with a shutter 43 reciprocated by an air cylinder 40. The shutter 43 is coupled to the air cylinder 40 by means of a rod 43 surrounded by a bellows 41. The shutter 43 may not completely close up the wafer inlet 32 but allow a clearance of some 1 mm width. The internal side wall of the carrier 34 is provided with grooves at regular pitches, in which the respective wafers 9 are held. Through the back side of the carrier 34 are bored holes for the respective wafers contained through which the wafer pusher 39 is to be introduced, and the wafers are fed on to the conveyor 18 inside the reaction chamber 9 through the inlet 32. The wafers are successively fed on to the conveyor 18 by means of the vertical movement of the carrier mount. In front of the inlet 32 is disposed a photo senser 44 for detecting the feed of wafers.

Meanwhile, in the receiving chamber 15, a carrier 54 to receive the wafers treated in the reaction chamber 9 is placed on a carrier mount 45, which is moved up and down by means of a feed screw 47 driven by a motor 46 in the same manner as the case of the carrier mount 35 in the feeding chamber 13. The carrier mount 45 is slantly attached. Like the feeding chamber 13, the receiving chamber 15 is also provided with a shutter 51 for opening and shutting the outlet 33. This shutter 51 is driven by an air cylinder 48 by means of a rod 50 surrounded by a bellows 49. Like the shutter 43, the shutter 51 may not completely close up the wafer outlet 33 but allow a clearance of some 1 mm width. In the vicinity of the outlet 33 is disposed an inclined guide rail 52 for introducing wafers 55 treated in the reaction chamber 9 into the carrier 54. The angle of inclination of the guide rail 52 should preferably be 30° from the level surface. The guide rail 52 is provided with e.g. a slit. In positions facing each other with the slit between is arranged a photo senser 53 for detecting the passage of the wafers 55.

Now I will describe the operation of the continuous gas plasma etching apparatus as described above.

First, the carrier 34 containing a plurality of untreated wafers 29 are set on to the carrier mount 35 by opening the hatch 14 of the feeding chamber 13, the empty carrier 54 is set on to the carrier mount 45 by opening the hatch 16 of the receiving chamber 15, and then the respective hatches 14 and 16 are closed. Then, by pushing a start switch of the control unit 17, all the processes for wafer etching treatment may be automatically conducted in the following sequence. That is, the rotary pump 12 and mechanical booster pump 10 are operated to adjust the pressures inside the reaction chamber 9, feeding chamber and receiving chamber to approximately $10^{-2}$ to $10^{-1}$ Torr. Then the air cylinders 40 and 48 automatically operate to open the shutters 43 and 51. The shutters 43 and 51 are intended for preventing the activated gas from penetrating into the feeding chamber 13 and receiving chamber 15. When the shutters 43 and 51 are opened, the motor 36 automatically operates to shift the carrier 34 by means of the rotation of the feed screw 37, and stops when the carrier 34 has reached a prescribed position. Subsequently, the wafer pusher 39 operates to push out one of the wafers in the carrier 34 on to the conveyer. When the photo senser 44 detect the passage of the wafers 29 and the air pusher 39 is restored to its original position, the belt 22 of the conveyer 18 is forwarded to the receiving chamber 15 side through one pitch of feed for placing a wafer by means of the operation of the motor 23, and stops where it is. Thus, a prescribed number of wafers 29 are placed on to the conveyer 18 by repeating at a prescribed frequency the process including the shifting of the carrier, pushing of the wafers 29 by means of the wafer pusher 39, and one-pitch feed of the belt 22. Thereupon, the shutters 43 and 51 are closed, and the reaction gas begins to flow from the reaction gas feed chamber 1 to the activation portion 3 through the conduit 2. The microwave oscillator 5 operates several seconds after the start of the reaction gas flow to apply a microwave to the activation portion 3 by means of the wave guide 6, thereby activating the reaction gas inside the activation portion 3. The activated gas is introduced into the reaction chamber 9 by means of the manifold 8 and nozzle pipe 27. The activated gas introduced into the reaction chamber 9 is discharged by means of the mechanical booster pump 10 and rotary pump 12 after etching the wafers 29 on the conveyer 18.

The time from the start to the end of the etching process is set by e.g. a timer, and the supply of the reaction gas and application of the microwave are stopped after such set time, thereby opening the shutters 43 and 51. Then the conveyer 18 moves through a pitch, and the etched wafer 55 slides over the guide rail 52 through the wafer outlet 33 to be received by the carrier 54. At the same time the wafers 29 are fed from the feeding chamber 13 on to the conveyer 18 by means of the pusher 39. When these operations have been repeated a prescribed number of times, the replacement of the treated wafers 55 with the untreated wafers 29 in the reaction chamber 9 is completed. In this replacing operation, there would naturally by achieved the lowering operation of the carriers 34 and 54, one-pitch feed of the conveyer 18, and detection of the wafer by means of the photo sensers 44 and 53 with every wafer replaced.

When the replacement of wafers is completed and the shutters 43 and 51 are closed, the supply of the activated gas into the reaction chamber 9 is started, thereafter repeating the same operations. Thus, when the wafers 29 in the carrier 34 are all etched and received by the carrier 54, an N₂ gas flows and replaces the residual gas within the apparatus, and then the exhaust system is stopped, thereby providing atmospheric pressure in the apparatus and finishing the processes.

According to the aforementioned continuous gas plasma etching apparatus, the operator can continuously perform totally automatic wafer etching treatment, excepting the replacement of the carriers 34 and 54. Since the activated gas, which has been branched off in the manifold 8, is jetted from the nozzle holes 28 of the nozzle tube 27 into the reaction chamber and discharged from a number of outlets 30 through the pores 26 in the belt 22, the activated gas may be uniformly distributed in the reaction chamber 9, thereby ensuring uniform etching of the wafers.

Although there has been described an embodiment of this invention, this invention is not limited to this precise embodiment. For example, instead of using the manifold 8, the activated gas may be introduced into the nozzle pipe 27 directly from the activated gas conduit. Further, the activated gas may be uniformly jetted by sparsely arranging the nozzle holes at the middle portion of the nozzle pipe 27 or reducing the diameter of such nozzle holes as well as by densely arranging the nozzle holes at each end portion of the nozzle pipe 27 or increasing the diameter of such nozzle holes. Moreover, in place of the sheet-like belt 22 with a number of pores 26, a plurality of linear belts put on pulleys may allow the etching gas satisfactorily to penetrate through the gaps between these linear belts. That is, the belt used may be of any type, provided it allows the activated gas to pass. The belt should suitably be made of Teflon-coated stainless steel.

Although, according to the above description of the embodiment, the wafer pusher 39 and shutters 43 and 51 are driven by the air cylinders 38, 40 and 48 respectively, they may be also driven by motors. Further, instead of using the wafer pusher 39, the wafers 29 in the feeding chamber 13 may be introduced into the reaction chamber 9 by means of an O-ring belt disposed in the feeding chamber 13. Likewise, the receiving chamber 15 may also be provided with an O-ring belt in lieu of the inclined guide rail 52, thereby delivering the treated wafers 55 to the carrier 54 in the receiving chamber 15. In this case the O-ring belt need not be inclined. Furthermore, the wafers 29 on the conveyer 18 may be pulled into the carrier 54 in the receiving chamber 15 by using a pulling means instead of the inclined guide rail 52.

As described above, the apparatus of this invention is an outstanding mass-producing apparatus capable of uniformly, satisfactorily, continously and automatically etching a number of semiconductor wafers.

What we claim is:

1. A continuous gas plasma etching apparatus comprising a reaction chamber having an inlet means and an outlet means; an activation portion disposed at a distance from said reaction chamber; a distributor means for uniformly supplying said reaction chamber with an activated gas produced in said activation portion; an exhaust means for exhausting the gas inside said reaction chamber from a plurality of gas outlets; a conveyer means disposed inside said reaction chamber to transfer workpieces from the inlet means side to the outlet means side in said reaction chamber; a feeding chamber disposed on the inlet means side of said reaction chamber to contain the workpieces; a workpiece feeding means for feeding the workpieces in said feeding chamber to said conveyer means by means of said inlet means; a first shutter means for opening and shutting said inlet means; a receiving chamber disposed on the outlet means side of said reaction chamber to receive the workpieces treated with said activated gas in said reaction chamber; a treated workpiece delivering means for introducing the treated workpieces in said reaction chamber into said receiving chamber through said outlet means; and a second shutter means for opening and shutting said outlet means.

2. A continuous gas plasma etching apparatus according to claim 1, wherein said distributor means is composed of a manifold pipe coupled with said activation portion by means of an activated gas conduit and nozzle pipe disposed in said reaction chamber, coupled with said manifold pipe, and having a number of nozzle holes facing said conveyer.

3. A continuous gas plasma etching apparatus according to claim 2, wherein said nozzle holes are relatively sparsely arranged in the vicinity of the central portion of said nozzle pipe or relatively densely arranged in the vicinity of each end portion of said nozzle pipe.

4. A continuous gas plasma etching apparatus according to claim 2, wherein the diameter of the nozzle holes in the vicinity of the central portion of said nozzle pipe is relatively small or the diameter of the nozzle holes in the vicinity of each end portion of said nozzle pipe is relatively large.

5. A continuous gas plasma etching apparatus according to claim 1, wherein said conveyor means is composed of an endless belt with a number of uniformly bored pores.

6. A continuous gas plasma etching apparatus according to claim 1, wherein said conveyer means is composed a number of parallel linear endless belts.

7. A continuous gas plasma etching apparatus according to claim 1, wherein said workpiece feeding means is composed of a pusher driven by an air cylinder, a carrier with a hole to allow penetration of said pusher to contain a number of workpieces to be treated is placed on a vertically movable carrier mount in said feeding chamber, said treated workpiece delivering means is composed of an inclined guide rail, and a carrier to receive a number of treated workpieces is slantly placed on a vertically movable carrier mount in said receiving chamber.

8. A continuous gas plasma etching apparatus according to claim 7, wherein a photo senser to detect the passage of the workpieces to be treated is disposed in the vicinity of said inlet means in said feeding chamber, and a photo senser to detect the passage of the treated workpieces is disposed in the vicinity of said outlet means.

9. A continuous gas plasma etching apparatus according to claim 1, wherein said activation portion is coupled with a microwave oscillator by means of a wave guide.

10. A continuous gas plasma etching apparatus according to claim 1, wherein said first and second shutter means are driven by air cylinders, respectively.

11. A continuous gas plasma etching apparatus according to claim 1, wherein said first and second shutter means are driven by motors, respectively.

12. A continuous gas plasma etching apparatus according to claim 1, wherein said workpiece feeding means is composed of a pusher driven by a motor.

13. A continuous gas plasma etching apparatus according to claim 1, wherein said workpiece feeding means and treated workpiece delivering means are composed of O-ring belts, respectively.

14. A continuous gas plasma etching apparatus according to claim 1, wherein said treated workpiece delivering means is composed of a pulling means for introducing said treated workpieces into said receiving chamber.

* * * * *